(12) United States Patent
Lin et al.

(10) Patent No.: US 9,391,633 B2
(45) Date of Patent: Jul. 12, 2016

(54) DIGITAL-TO-ANALOG CONVERTER FOR REDUCING POP NOISE AND HARMONIC TONE AND RELATED CONVERTING METHOD

(75) Inventors: Wei-Chun Lin, Taipei (TW); Yi-Chang Tu, Tai-Nan (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 2149 days.

(21) Appl. No.: 12/490,345

(22) Filed: Jun. 24, 2009

(65) Prior Publication Data

US 2009/0326692 A1    Dec. 31, 2009

(30) Foreign Application Priority Data

Jun. 26, 2008    (TW) ................................ 97123909 A

(51) Int. Cl.
*H03M 3/00*    (2006.01)
*H03M 1/12*    (2006.01)
*H03M 7/30*    (2006.01)

(52) U.S. Cl.
CPC ............ *H03M 3/346* (2013.01); *H03M 1/1215* (2013.01); *H03M 3/30* (2013.01); *H03M 3/358* (2013.01); *H03M 3/376* (2013.01); *H03M 3/50* (2013.01); *H03M 7/3004* (2013.01)

(58) Field of Classification Search
USPC ............. 700/94; 341/141, 143, 146, 151, 152
See application file for complete search history.

(56) References Cited

U.S. PATENT DOCUMENTS

| 5,257,026 | A | * | 10/1993 | Thompson et al. ........... 341/118 |
| 5,648,777 | A | * | 7/1997 | Bays et al. .................... 341/110 |
| 5,889,483 | A | | 3/1999 | Tagami et al. |
| 5,977,896 | A | | 11/1999 | Kohdaka |
| 6,853,321 | B2 | | 2/2005 | Ohashi |
| 6,927,720 | B2 | * | 8/2005 | Matsumoto ................... 341/150 |
| 6,982,662 | B2 | | 1/2006 | Heo |
| 2005/0063476 | A1 | * | 3/2005 | Miller et al. .................. 375/242 |

FOREIGN PATENT DOCUMENTS

| JP | 9153814 | 6/1997 |
| JP | P200136409 A | 2/2001 |
| JP | P2001352247 A | 12/2001 |
| JP | P2005318123 A | 11/2005 |

OTHER PUBLICATIONS

IEEE, "IEEE100 the Authoritative Dictionary of IEEE Standards Terms", 2000, IEEE, Seventh Edition, p. 887.*

* cited by examiner

*Primary Examiner* — Jesse Elbin
(74) *Attorney, Agent, or Firm* — Birch, Stewart, Kolasch & Birch, LLP

(57) ABSTRACT

A digital-to-analog converting (DAC) circuit is utilized for converting a 1-bit stream into an analog output signal. The DAC includes an N-bit encoder, a multiplexer, a low-pass filter, and a digital-to-analog conversion circuit. The N-bit encoder is utilized for receiving the 1-bit stream and encoding the 1-bit stream to generate an N-bit stream, where N is larger than 1; the multiplexer is utilized for selectively outputting the N-bit stream or a zero signal as an output signal according to a selection signal; the low-pass filter is utilized to generate a filtered output signal according to the output signal; and the digital to analog conversion circuit is utilized to generate the analog output signal according to the filtered output signal.

18 Claims, 2 Drawing Sheets

DIGITAL-TO-ANALOG CONVERTER FOR REDUCING POP NOISE AND HARMONIC TONE AND RELATED CONVERTING METHOD

BACKGROUND OF THE INVENTION

1. Field of the Invention

The present invention relates to a digital-to-analog converter, and more particularly, to a digital-to-analog converter for reducing pop noise and harmonic tone and related converting method.

2. Description of the Prior Art

In audio processing, an over-sampling 1-bit sigma-delta modulation signal is generally used for data transmission. When using this data transmission technique, however, a "pop" will be heard due to the occurrence of discontinuous points on the waveform of the audio signal (e.g., starting/finishing displaying the audio signal), causing discomfort to the listener. In addition, when finishing displaying the audio signal and under the condition that the audio signal has a lower sampling rate, if the last audio data has a higher period (i.e., more taps of a low-pass filter in a digital-to-analog converter are used) and is still in a display loop, unexpected harmonic tones are produced and a frequency of a fundamental harmonic is decreased. The frequencies of the harmonic tones are shown as follows:

$$f_{tone} = \frac{f_s}{N_{tap}} \times n, n = 1, 2, 3 \ldots ,$$

where $f_{tone}$ is the frequency of the harmonic tone, $f_s$ is an over-sampling rate of the audio signal, $N_{tap}$ is a number of the taps which the low-pass filter uses.

When the lowest frequency of the harmonic tones is reduced, even if the frequency of the fundamental harmonic is not within an audio band (generally defined within 20 Hz-20 kHz), the post-processing of the audio signal may be influenced when the fundamental harmonic is within 20 kHz-100 kHz.

SUMMARY OF THE INVENTION

It is therefore an objective of the present invention to provide a digital-to-analog converter for reducing the pop noise and the unexpected harmonic tones.

According to one embodiment of the present invention, an apparatus for converting a digital audio signal into an analog audio signal comprises a first circuit, a multiplexer, a low-pass filter and a digital-to-analog converter. The first circuit is configured to receiving the digital audio signal and converting the digital audio signal into an N-bit sigma-delta modulation signal, wherein N is larger than 1; The multiplexer is utilized for receiving the N-bit sigma-delta modulation signal and a zero signal, and selectively outputting the N-bit sigma-delta modulation signal or the zero signal as an output signal according to a selection signal. The low-pass filter is utilized for generating a filtered output signal according to the output signal. The digital-to-analog converter is utilized for generating the analog audio signal according to the filtered output signal.

According to one embodiment of the present invention, a digital-to-analog converting circuit for converting a 1-bit stream into an analog output signal is disclosed. The digital-to-analog converter includes an N-bit encoder, a multiplexer, a low-pass filter, and a digital-to-analog conversion circuit. The N-bit encoder is utilized for receiving the 1-bit stream and encoding the 1-bit stream to generate an N-bit stream, where N is larger than 1; the multiplexer is utilized for selectively outputting the N-bit stream or a zero signal as an output signal according to a selection signal; the low-pass filter is utilized to generate a filtered output signal according to the output signal; and the digital to analog conversion circuit is utilized to generate the analog output signal according to the filtered output signal.

According to one embodiment of the present invention, a method for processing a digital audio signal to generate an analog signal is disclosed. The method comprises: processing the digital audio signal to generate an N-bit stream; selectively outputting the N-bit stream or a zero signal as an output signal according to a selection signal; filtering the output signal to generate a filtered output signal; and converting the filtered output signal into the analog output signal.

These and other objectives of the present invention will no doubt become obvious to those of ordinary skill in the art after reading the following detailed description of the preferred embodiment that is illustrated in the various figures and drawings.

DETAILED DESCRIPTION

To prevent the above-mentioned "pop" issue from occurring when finishing playing the audio signal, the present invention provides a digital-to-analog converter in which, when finishing playing the audio signal, an exactly zero signal is inputted into a low-pass filter of the digital-to-analog converter. Therefore, when finishing playing the audio signal, discontinuous points on the waveform of the audio signal are smoothed, and the pop issue is reduced. In the conventional 1-bit sigma-delta modulation signal, a digital signal "0" represents a value "−1" and a digital signal "1" represents a value "+1". Therefore, the conventional 1-bit sigma-delta modulation signal cannot output an exact zero. In the present invention, a 1-bit sigma-delta modulation signal is encoded into a 2-bit sigma-delta modulation (SDM) signal, and the 2-bit sigma-delta modulation signal can represent four values at least including the values "0", "+1", "−1". Therefore, the digital-to-analog converter can output an exactly zero signal when finishing playing the audio signal, to solve the "pop" issue.

Figure 1:
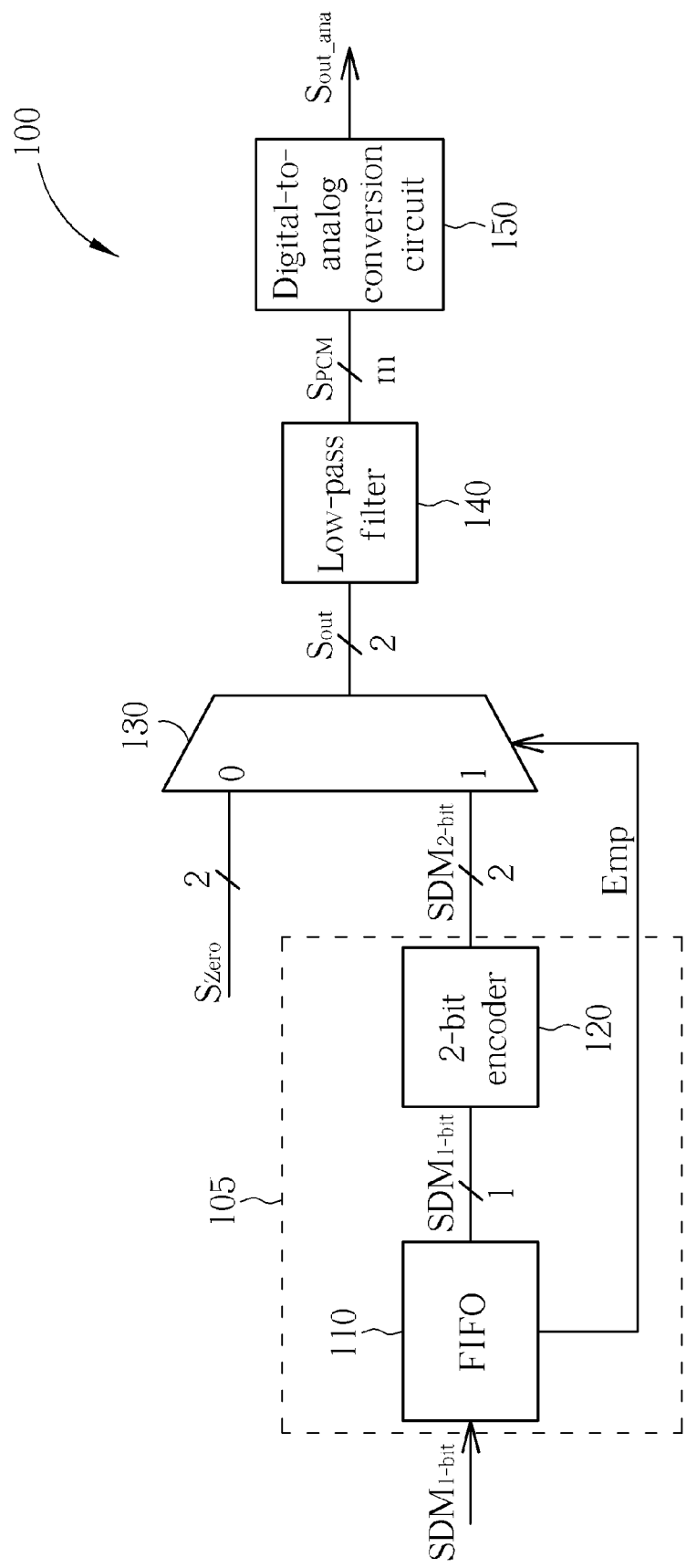
FIG. 1 is a digital-to-analog converter according to a first embodiment of the present invention.

Please refer to FIG. 1. FIG. 1 is a digital-to-analog converter according to a first embodiment of the present invention. As shown in FIG. 1, the digital-to-analog converter 100 includes a circuit 105, a multiplexer 130, a low-pass filter 140, and a digital-to-analog conversion circuit 150. In an embodiment, the circuit 105 includes a First-In-First-Out (FIFO) unit 110, a 2-bit encoder 120. The multiplexer 130 is controlled by the selection signal corresponding to the data amount of the audio signal in the circuit 105. The operations of the digital-to-analog converter 100 are described in the following.

In the embodiment, the circuit 105 is used for generating 2-bit sigma-delta modulation signal $SDM_{2\text{-}bit}$. In an embodiment, the circuit 105 includes a FIFO unit 110 and a 2-bit encoder 120. First, a 1-bit sigma-delta modulation signal $SDM_{1\text{-}bit}$ is inputted into the FIFO unit 110 of the circuit 105.

Then, the 2-bit encoder 120 of the circuit 105 encodes the 1-bit sigma-delta modulation signal $SDM_{1\text{-}bit}$ to generate a 2-bit sigma-delta modulation signal $SDM_{2\text{-}bit}$. In this embodiment, the digital signals "0" and "1" in the 1-bit sigma-delta modulation signal $SDM_{1\text{-}bit}$ are respectively encoded as "11" (representing the value "−1") and "01" (representing the value "+1"). Additionally, the value "0" is encoded as a digital signal "00". In another embodiment, the 2-bit encoder 120 receives 1-bit SDM signal and converters the 1-bit SDM signal into the 2-bit SDM signal. The FIFO 110 temporarily stores the 2-bit SDM signal from the 2-bit encoder 120 and outputs the 2-bit SDM signal to the multiplexer 130. The multiplexer 130 selectively outputs the 2-bit sigma-delta modulation signal $SDM_{2\text{-}bit}$ or the exactly zero signal $S_{zero}$ as an output signal $S_{out}$, where, when the FIFO unit 110 is not empty (i.e. the audio signal is continuously played), the multiplexer 130 outputs the 2-bit sigma-delta modulation signal $SDM_{2\text{-}bit}$ according to a selection signal Emp; and when the FIFO unit 110 is empty (i.e. the audio signal is stopped playing), the multiplexer 130 outputs the exactly zero signal $S_{zero}$ according to the selection signal Emp. That is, the multiplexer 130 outputs the 2-bit sigma-delta modulation signal $SDM_{2\text{-}bit}$ into the low-pass filter 140 when the audio signal is playing and the multiplexer 130 outputs the exactly zero signal $S_{zero}$ into the low-pass filter 140 when the audio signal is stopped playing. Then, the low-pass filter 140 generates an m-bit pulse-code modulation (PCM) signal $S_{PCM}$ according to the output signal $S_{out}$. In one embodiment, the low-pass filter 140 can be implemented by a finite impulse response (FIR) digital filter which can be implemented by delay units, multipliers and adders, or implemented by multiplexers or a look-up table. Finally, the digital-to-analog conversion circuit 150 generates an analog output signal $S_{ou\_ana}$ according to the PCM signal $S_{PCM}$.

In this embodiment, when the audio signal is stopped playing such that the FIFO unit 110 is empty, the multiplexer 130 outputs the exactly zero signal $S_{zero}$ into the low-pass filter 140 according to the selection signal Emp from the FIFO unit 110. After filtering by the low-pass filter 140, the filtered output signal (i.e., PCM signal $S_{PCM}$) gradually approaches a zero point. Therefore, discontinuous points on the waveform of the output audio signal (filtered output signal) can be smoothed to prevent the occurrence of the pop. In addition, because the exactly zero signal $S_{zero}$ is encoded as the digital signal "00", the output of the low-pass filter 140 will be zero after a period ($N_{tap}*f_s$), harmonic tones will not be produced and the post-processing of the audio signal will therefore not be influenced.

Figure 2:
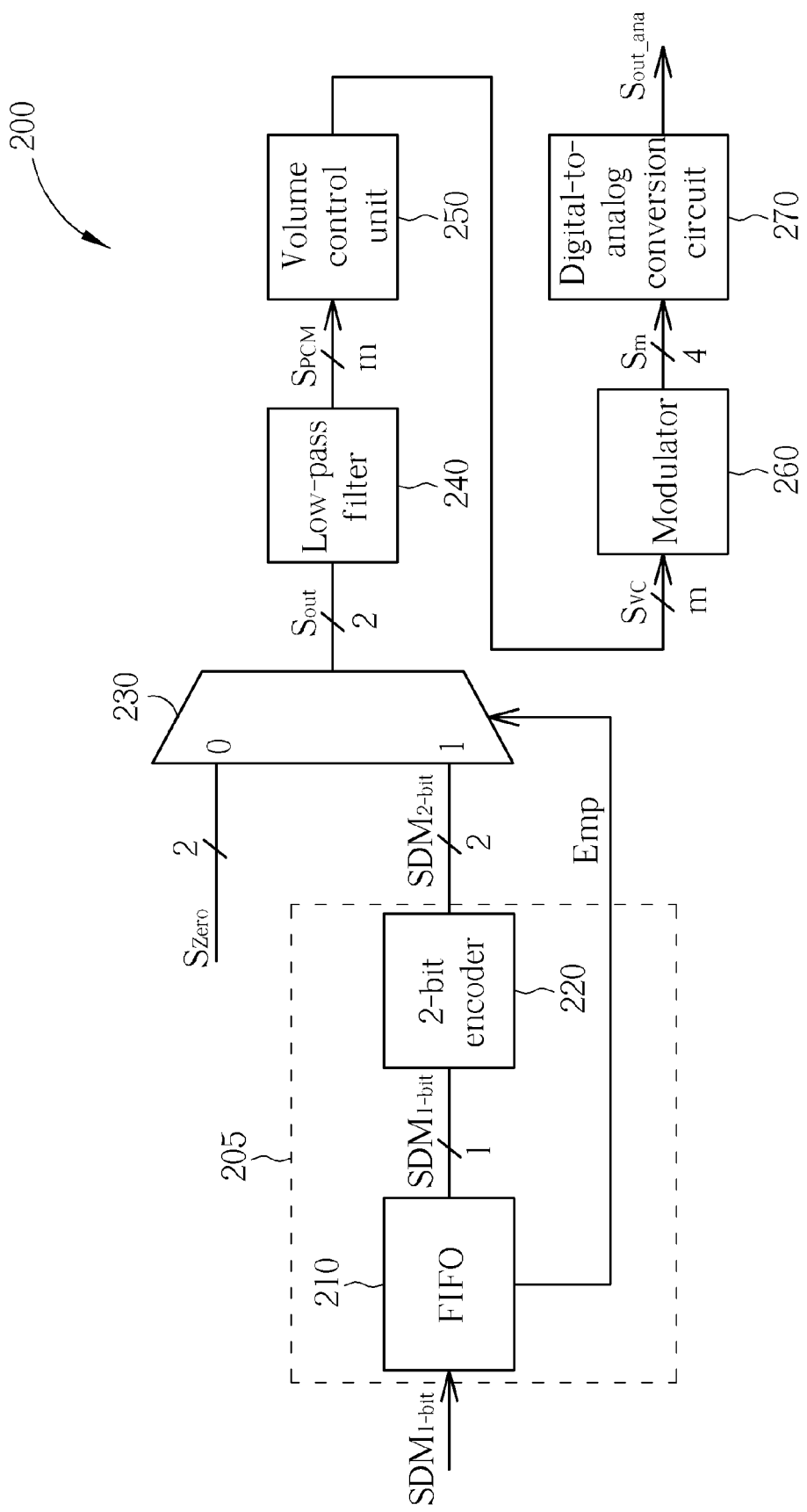
FIG. 2 is a digital-to-analog converter according to a second embodiment of the present invention.

The digital-to-analog converter 100 can apply to a direct stream digital (DSD) technique of a super audio compact disc (SACD), where the DSD techniques provide a frequency response up to 100 kHz. FIG. 2 is a digital-to-analog converter 200 according to a second embodiment of the present invention. As shown in FIG. 2, the digital-to-analog converter 200 includes a circuit 205, a multiplexer 230, a low-pass filter 240, a volume control unit 250, a modulator 260, and a digital-to-analog conversion circuit 270. The circuit 205 comprises a FIFO unit 210, a 2-bit encoder 220. The operations of the digital-to-analog converter 200 are described in the following.

First, audio data undergoes an analog-to-digital conversion and is over-sampled at a sampling rate that is 64 times a sampling rate of the compact disc (i.e., sampling rate $f_s=64\times 44.1$ kHz) to generate a 1-bit sigma-delta modulation signal $SDM_{1\text{-}bit}$. Then, the 1-bit sigma-delta modulation signal $SDM_{1\text{-}bit}$ is inputted into the FIFO unit 210 of the circuit 205. The 2-bit encoder 220 of the circuit 205 then encodes the 1-bit sigma-delta modulation signal $SDM_{1\text{-}bit}$ to generate a 2-bit sigma-delta modulation signal $SDM_{2\text{-}bit}$. The multiplexer 230 selectively outputs the 2-bit sigma-delta modulation signal $SDM_{2\text{-}bit}$ or the exactly zero signal $S_{zero}$ as an output signal $S_{out}$, where, when the FIFO unit 210 is not empty (i.e., the audio signal is continuously played), the multiplexer 230 outputs the 2-bit sigma-delta modulation signal SDM2-bit according to a selection signal Emp; and when the FIFO unit 210 is empty (i.e., the audio signal is stopped playing), the multiplexer 230 outputs the exactly zero signal $S_{zero}$ according to the selection signal Emp. That is, the multiplexer 230 outputs the 2-bit sigma-delta modulation signal $SDM_{2\text{-}bit}$ into the low-pass filter 240 when the audio signal is playing and the multiplexer 230 outputs the exactly zero signal $S_{zero}$ into the low-pass filter 240 when the audio signal is stopped playing. Then, the low-pass filter 240 generates an m-bit PCM signal $S_{PCM}$ according to the output signal $S_{out}$. In this embodiment, the low-pass filter 240 can be implemented by a FIR digital filter which can be implemented by delay units, multipliers and adders, or implemented by multiplexers or a look-up table. In addition, the volume control unit 250 is used to adjust the PCM signal $S_{PCM}$ to generate an adjusted output signal $S_{VC}$. Then, the modulator 260 modulates the adjusted output signal $S_{VC}$ to generate a 4-bit modulated output signal $S_m$. The digital-to-analog conversion circuit 270 generates an analog output signal $S_{out\_ana}$ according to the modulated output signal $S_m$. Additionally, the low-pass filter 240 and the volume control unit 250 can also be implemented by software.

Those skilled in the art will readily observe that numerous modifications and alterations of the device and method may be made while retaining the teachings of the invention.

What is claimed is:

1. An apparatus for converting a digital audio signal into an analog audio signal, the apparatus comprising:
 a first circuit configured to receiving the digital audio signal and converting the digital audio signal into an N-bit sigma-delta modulation signal, wherein N is larger than 1;
 a multiplexer, for receiving the N-bit sigma-delta modulation signal and a zero signal, and selectively outputting the N-bit sigma-delta modulation signal or the zero signal as an output signal according to a selection signal;
 a low-pass filter, coupled to the multiplexer, for generating a filtered output signal according to the output signal, wherein the filtered output signal is a pulse-code modulation (PCM) signal; and
 a digital-to-analog converter, coupled to the low-pass filter, for generating the analog audio signal according to the filtered output signal.

2. The apparatus of claim 1, wherein the digital audio signal is 1-bit sigma-delta modulation signal.

3. The apparatus of claim 1, wherein the first circuit comprises a storage unit and a N-bit encoder.

4. The apparatus of claim 1, wherein the selection signal corresponds to an amount of the digital audio signal in the first circuit.

5. The apparatus of claim 1, further comprising: a volume control unit for adjusting the filtered output signal.

6. A digital-to-analog converting (DAC) circuit for converting a 1-bit stream, comprising:
 an N-bit encoder for receiving the 1-bit stream encoding the 1-bit stream to generate an N-bit stream, wherein N is larger than 1;

a multiplexer, for receiving the N-bit stream and a zero signal, and selectively outputting the N-bit stream or the zero signal as an output signal according to a selection signal;

a low-pass filter, coupled to the multiplexer, for generating a filtered output signal according to the output signal, wherein the filtered output signal generated from the low-pass filter is a pulse-code modulation (PCM) signal; and a digital-to-analog conversion circuit, coupled to the low-pass filter, for generating an analog output signal according to the filtered output signal.

7. The DAC circuit of claim 6, wherein N is equal to 2.

8. The DAC circuit of claim 6, further comprising: a storage unit for temporarily storing 1-bit stream.

9. The DAC circuit of claim 8, wherein when the storage device is not empty, the multiplexer outputs the N-bit stream according to the selection signal; and when the storage device is empty, the multiplexer outputs the exactly zero signal according to the selection signal.

10. The DAC circuit of claim 6, wherein the 1-bit stream is a sigma-delta modulated signal.

11. The DAC circuit of claim 6, wherein the 1-bit stream is over-sampled at a sampling rate of M*44.1 kHz.

12. The DAC circuit of claim 6, further comprising a volume control unit and a modulator.

13. The DAC circuit of claim 12, wherein the modulated output signal generated from the modulator is a 4-bit stream.

14. A method for processing a digital audio signal to generate an analog audio signal, the method comprising:

processing the digital audio signal to generate an N-bit stream; receiving a zero signal;

selectively outputting the N-bit stream or the zero signal as an output signal according to a selection signal;

filtering the output signal to generate a filtered output signal, wherein the filtered output signal is a pulse-code modulation (PCM) signal; and converting the filtered output signal into the analog audio signal.

15. The method of claim 14, wherein N is equal to 2.

16. The method of claim 14, further comprises: storing the digital audio signal into a storage unit, wherein the selection signal corresponds to a data amount stored in the storage unit.

17. The method of claim 14, wherein the digital audio signal is a 1-bit sigma-delta modulated signal.

18. The method of claim 14, wherein the filtered output signal is adjusted and modulated before the filtered output signal is converted.

* * * * *